(12) United States Patent
Mueller et al.

(10) Patent No.: US 8,426,848 B2
(45) Date of Patent: Apr. 23, 2013

(54) ELECTRONIC DEVICE

(75) Inventors: David Christoph Mueller, Frankfurt am Main (DE); Pawel Miskiewicz, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 77 days.

(21) Appl. No.: 12/989,164

(22) PCT Filed: Mar. 26, 2009

(86) PCT No.: PCT/EP2009/002232
§ 371 (c)(1),
(2), (4) Date: Oct. 22, 2010

(87) PCT Pub. No.: WO2009/129912
PCT Pub. Date: Oct. 29, 2009

(65) Prior Publication Data
US 2011/0037064 A1    Feb. 17, 2011

(30) Foreign Application Priority Data
Apr. 24, 2008  (EP) .................................... 08007889

(51) Int. Cl.
*H01L 29/08* (2006.01)
(52) U.S. Cl.
USPC .................. 257/40; 257/E51.006; 438/99
(58) Field of Classification Search .............. 257/40, 257/213, 288, E51.017, E51.013, E51.046, 257/57, 59, 66, 72, 99, 347, 369, 295, 410, 257/E21.051, E21.535, E51.006; 438/99, 438/3, 118, 82, 149, 199, 761; 524/544
See application file for complete search history.

(56) References Cited

U.S. PATENT DOCUMENTS

| 5,630,941 | A | 5/1997 | Burger et al. |
| 5,861,235 | A | 1/1999 | Harkness et al. |
| 2005/0104058 | A1* | 5/2005 | Veres et al. ............... 257/40 |
| 2006/0147723 | A1* | 7/2006 | Jing et al. ............... 428/421 |
| 2007/0023141 | A1 | 2/2007 | Mehan et al. |
| 2007/0077681 | A1 | 4/2007 | Dotz et al. |
| 2007/0106056 | A1* | 5/2007 | Itatani ..................... 528/310 |
| 2007/0190871 | A1 | 8/2007 | Patel et al. |
| 2010/0044687 | A1* | 2/2010 | Kalb et al. ............... 257/40 |

FOREIGN PATENT DOCUMENTS

| WO | WO 03/052841 A1 | 6/2003 |
| WO | WO 2006/104665 A1 | 10/2006 |
| WO | WO 2008/131836 A1 | 11/2008 |

OTHER PUBLICATIONS

International Search Report of PCT/EP2009/002232 (Jun. 5, 2009).
D. E. Hull et al., "THV Fluoroplastic," Modern Fluoropolymers (1997) pp. 257-270.
W. Oh et al., "Synchrotron X-Ray Reflectivity Studies of Nano-Porous Organosilicate Thin Films with Low Dielectric Constants," J. Applied Crystallography, vol. 40 (2007) pp. S626-S630.
"Well-Architectured Fluoropolymers," pp. 202-215.

(Continued)

*Primary Examiner* — Ha Tran T Nguyen
*Assistant Examiner* — Vongsavanh Sengdara
(74) *Attorney, Agent, or Firm* — Millen, White, Zelano & Branigan, P.C.

(57) ABSTRACT

The invention relates to an organic electronic (OE) device, in particular a transistor, comprising an interlayer between the gate insulator and the gate electrode, to novel processes for preparing the device, and to dielectric materials for use in the interlayer.

22 Claims, 8 Drawing Sheets

OTHER PUBLICATIONS

D. K. Owens et al., "Estimation of the Surface Free Energy of Polymers," Journal of Applied Polymer Science, vol. 13 (1969) pp. 1741-1747.

"Surface Tensions of Polymers," IGB Fraunhofer Website—http://www.igb.fraunhofer.de/WWW/GF/GrenzflMem/gf-physik/en/GFphys-PolymOberfl.en.html.

"Surface and Interfacial Tensions of Polymers, Oligomers, Plasticizers, and Organic Pigments," Polymer Handbook, $4^{th}$ Edition, p. 526 ff.

D. M. Brewis, "Thermodynamic Approach to Adhesion Problems," Industrial Adhesion Problems, Chapter 3 pp. 60-67.

B. Stadlober et al., "High-Mobility Pentacene Organic Field-Effect Transistors with a High-Dielectric-Constant Fluorinated Polymer Film Gate Dielectric," Applied Physics Letters, vol. 86, No. 24 (2005) pp. 242902-1-242902-3.

\* cited by examiner

ELECTRONIC DEVICE

FIELD OF INVENTION

The invention relates to an organic electronic (OE) device, in particular a transistor, comprising an interlayer between the gate insulator and the gate electrode, to novel processes for preparing the device, and to dielectric materials for use in the interlayer.

BACKGROUND AND PRIOR ART

Organic field effect transistors (OFETs) are used in display devices and logic capable circuits. A conventional OFET typically comprises source, drain and gate electrodes, a semiconducting layer comprising an organic semiconductor (OSC) material, and a gate insulator layer comprising a dielectric material between the OSC layer and the gate electrode.

FIG. 1 shows a conventional top gate OFET device according to prior art, comprising a substrate (1), source and drain electrodes (2), an OSC layer (3), a gate insulator layer (4) comprising a dielectric, a gate electrode (5), and a second insulator or protection layer (6) to shield the gate electrode from further layers or devices provided on top of the OFET.

FIG. 2 shows a conventional bottom gate OFET device according to prior art, comprising a substrate (1), source and drain electrodes (2), an OSC layer (3), a gate insulator layer (4) comprising a dielectric, a gate electrode (5), and a second insulator or protection layer (6) to shield the source and drain electrodes from further layers or devices provided on top of the OFET.

WO 03/052841 A1 discloses an OFET wherein the gate insulator layer comprises a dielectric material having low permittivity $\in$ (also known as relative permittivity or dielectric constant) of less than 3.0 ("low k material"). The use of such low k materials is reported to reduce charge trapping at the dielectric/OSC interface and to give improved transistor performance, in particular in devices prepared by solution processing. WO 03/052841 A1 further reports that commercially available fluoropolymers such as Cytop™ (from Asahi Glass) or Teflon AF™ (from DuPont) are especially suitable as low k materials.

The use of fluoropolymers as gate insulator is advantageous for solution processed OFET devices wherein the OSC material is selected from soluble, substituted oligoacenes, such as pentacene, tetracene or anthracene, or heterocyclic derivatives thereof, as disclosed for example in WO 2005/055248. These OSC materials are soluble in most common organic solvents. Therefore, when preparing a top gate device, the solvents for the gate insulator formulation have to be carefully chosen, in order to avoid dissolution of the OSC material when depositing the formulation for the gate insulator (4) on top of the OSC layer (3). Similarly, when preparing a bottom gate device dissolution of the gate insulator material has to be avoided when depositing the formulation for the OSC layer (3) on top of the gate insulator (4). Since fluoropolymers are soluble in perfluorinated solvents, which are orthogonal to the typical solvents used for the above-mentioned OSC materials, they are especially suitable as gate insulator material in these devices.

However, the above-mentioned fluoropolymers have certain drawbacks, especially regarding mass production of OFET devices. The main drawbacks are based on the poor processability and limited structural integrity of the fluoropolymers. Thus, fluoropolymers often do not adhere well on the substrate (1) and the OSC layer (3). Also, it is often difficult to process and adhere further coatings, like the gate electrode (5) or protection layers (6), on top of the gate insulator (4) due to bad adhesion (peeling off) and bad wetting. In addition, many fluoropolymers, like e.g. those of the Cytop™ series, have low glass temperatures $T_g$ (~100-130° C.), which may cause problems during certain process steps. For example, heating of the dielectric layer to $T_g$ when applying a metallized gate electrode layer on top of it, e.g. by sputtering, can cause cracking of the polymer due to built-in stress. Even when there is no residual stress in the film, heating above $T_g$ can cause differential expansion and hence wrinkling of the polymer. On the other hand, fluoropolymers with higher $T_g$, like those of the Teflon AF™ series (e.g. Teflon AF 2400 with $T_g$=240° C.), may overcome the wrinkling or cracking problems, but do often not coat well on big substrates, and provide bad adhesion for additional layers.

It is therefore an aim of the present invention to provide improved materials and methods for preparing electronic devices, in particular top gate OFETs, which do not have the drawbacks of prior art materials and methods, and allow time-, cost- and material-effective production of electronic devices on large scale. It is especially desired to improve adhesion and structural integrity of the dielectric layer when manufacturing an electronic device by solution processing techniques. Another aim of the invention is to provide improved electronic devices, especially OFETs, obtained from such materials and methods. Other aims of the present invention are immediately evident to the person skilled in the art from the following detailed description.

It was found that these aims can be achieved by providing methods, materials and devices as claimed in the present invention. In particular, the inventors of the present invention have found that it is possible to overcome at least some of the above-mentioned drawbacks by applying an interlayer between the gate insulator layer and the gate electrode and/or the gate electrode protection layer, wherein said interlayer comprises a copolymer comprising polar repeating units, like vinylidene fluoride or vinylfluoride, and unpolar repeating units, like perfluoroalkylene units. The use of such an interlayer improves adhesion, wettability and structural integrity of the gate insulator layer during application of further device layers in subsequent manufacturing process steps.

SUMMARY OF THE INVENTION

The invention relates to an electronic device comprising an organic semiconductor (OSC) layer (3),
a gate electrode (5),
a gate insulator layer (4) comprising a dielectric material and being located between the OSC layer (3) and the gate electrode (5),
optionally an additional insulator layer (6) covering the gate electrode (5) and the gate insulator layer (4),
wherein the device further comprises at least one interlayer (7) between the gate insulator layer (4) and the gate electrode (5), or between the gate electrode (5) and the additional insulator layer (6),
characterized in that the interlayer (7) comprises, preferably essentially consists of, very preferably exclusively consists of, a copolymer comprising at least one polar repeating unit and at least one unpolar repeating unit, wherein "polar unit" means a repeating unit of which the homopolymer has a surface energy $\geqq 30$ mN/m and "unpolar unit" means a repeating unit of which the homopolymer has a surface energy $\leqq 25$ mN/m.

The invention further relates to a process for preparing an electronic device as described above and below, comprising the steps of b) depositing a first layer of dielectric material (4) on an OSC layer (3),
and
c1) depositing at least one interlayer (7) as described above and below on the first dielectric layer (4),
d1) depositing a gate electrode (5) on at least a part of the interlayer (7),
e1) optionally depositing a second layer of dielectric material (6) on the gate electrode (5) and the interlayer (7),
or, alternatively to steps c1)-e1),
c2) depositing a gate electrode (5) on at least a part of the first dielectric layer (4),
d2) depositing at least one interlayer (7) as described above and below on the gate electrode (5) and the first dielectric layer (4),
e2) depositing a second layer of dielectric material (6) on the interlayer (7).

The invention further relates to an electronic device obtained by a process as described above and below.

Preferably the electronic device is an organic field effect transistor (OFET) or thin film transistor (TFT), preferably a top gate transistor, an integrated circuit (IC), or a Radio Frequency Identification (RFID) tag.

DETAILED DESCRIPTION OF THE INVENTION

Figure 1:
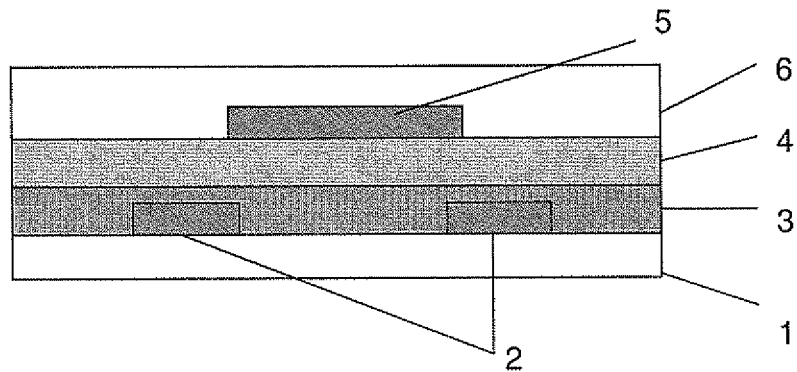
FIG. 1 depicts a top gate OFET device according to prior art.
Figure 2:
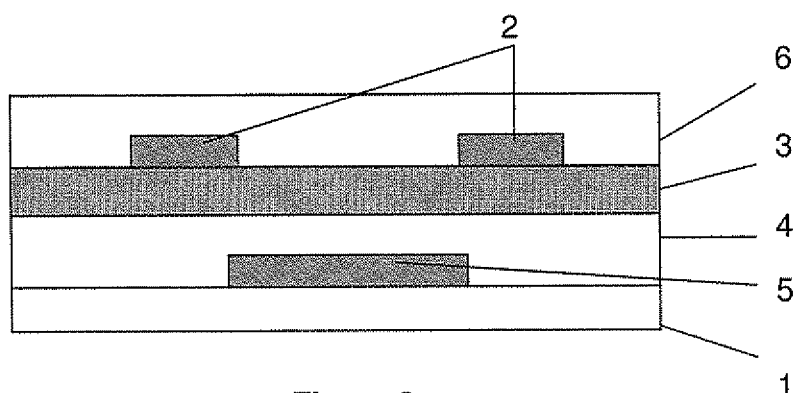
FIG. 2 depicts a bottom gate OFET device according to prior art.

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention "polymer" means a polymeric compound having >10, very preferably >20 repeating units, preferably having a molecular weight $M_w$>3,000, very preferably >5,000, and "oligomer" means an oligomeric compound with >1 and ≦20, preferably ≦10, repeating units, preferably having a molecular weight $M_w$<3,000, very preferably <2,000.

Unless stated otherwise, the molecular weight of oligomers and polymers means the weight average molecular weight $M_w$, which is determined by GPC in a suitable solvent against polystyrene standards.

The terms "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291). A copolymer may comprise two or more different repeating units.

A preferred electronic device according to the present invention, which is preferably a top gate OFET, comprises the following components:
optionally a substrate (1),
source and drain electrodes (2),
an OSC layer (3),
a gate electrode (5),
a gate insulator layer (4) comprising a dielectric material, located between the OSC layer (3) and the gate electrode (5),
optionally a second insulator layer (6) on top of the gate electrode (5),
an interlayer (7) as described above and below located between the gate insulator (4) and the gate electrode (5), or between the gate electrode and the second insulator layer (6).

Figure 3:
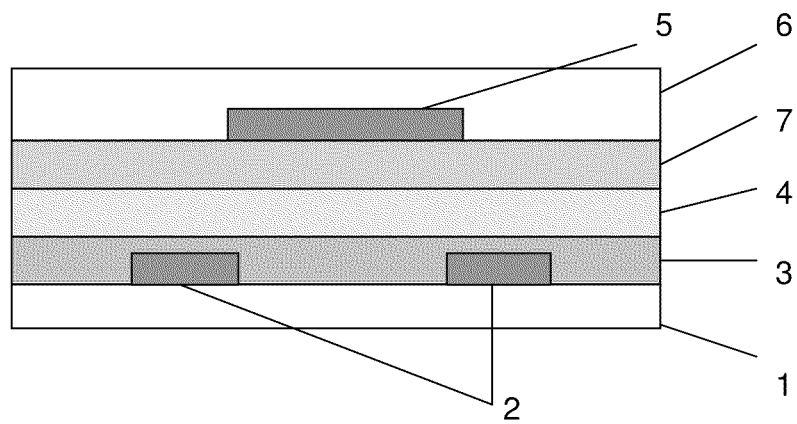
FIG. 3 depicts a top gate OFET device according to a first preferred embodiment of the present invention.

FIG. 3 exemplarily illustrates a top gate OFET device according to a first preferred embodiment of the present invention, comprising a substrate (1), source and drain electrodes (2), an OSC layer (3), a gate insulator layer (4) comprising a dielectric material, a gate electrode (5), a second insulator or protection layer (6) to shield the gate electrode from further layers or devices provided on top of the OFET, and an interlayer (7) comprising a copolymer as described above and below, which is located between the gate insulator layer (4) and the gate electrode (5).

Figure 5:
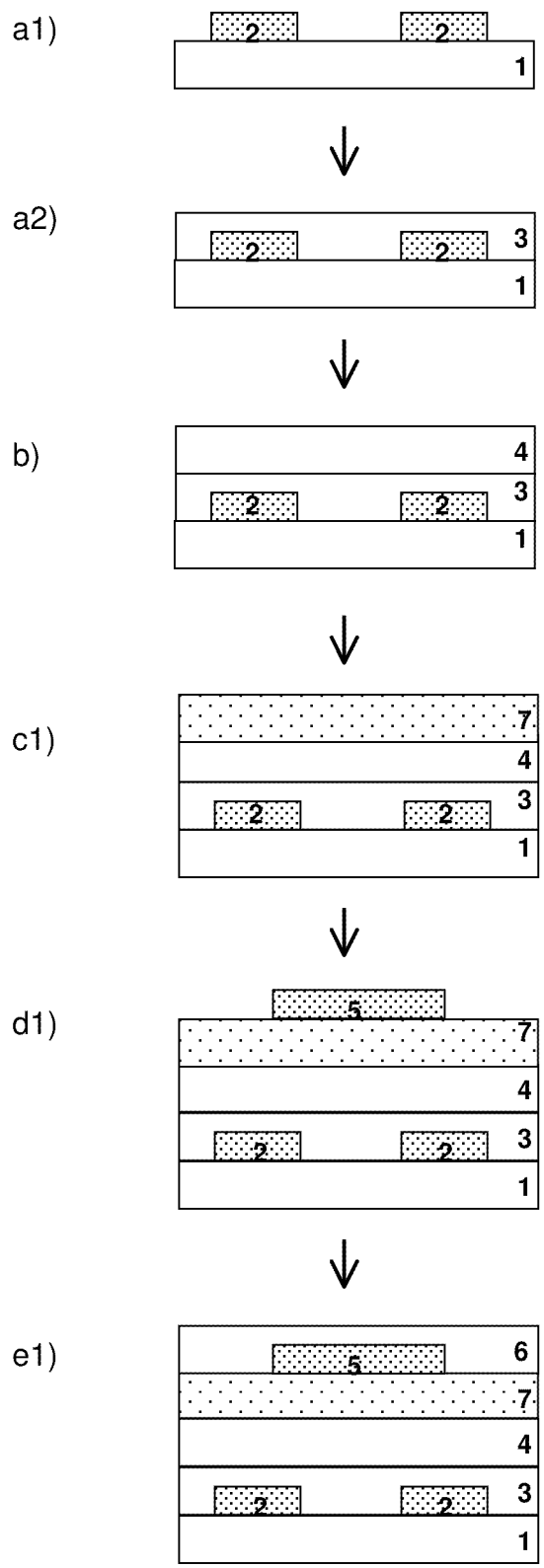
FIG. 5 illustrates a process for preparing an OFET according to the first embodiment of the present invention.

A preferred process for preparing said device of the first preferred embodiment is shown in FIG. 5 and comprises the following steps:
a1) depositing source and drain electrodes (2) on a substrate (1),
a2) depositing a layer of OSC material (3) on the substrate (1) and the source and drain electrodes (2),
b) depositing a first layer of dielectric material (4) on the OSC layer (3),
c1) depositing at least one interlayer (7) as described above and below on the first dielectric layer (4),
d1) depositing a gate electrode (5) on at least a part of the interlayer (7),
e1) optionally depositing a second layer of dielectric material (6) on the gate electrode (5) and the interlayer (7).

Figure 4:
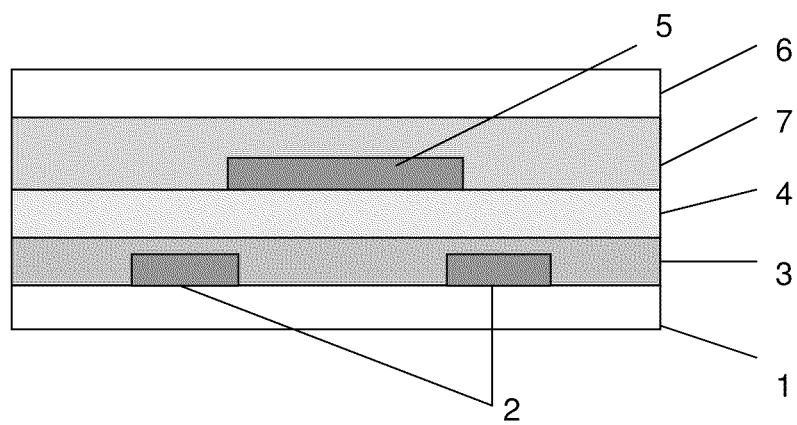
FIG. 4 depicts a top gate OFET device according to a second preferred embodiment of the present invention.

FIG. 4 exemplarily illustrates a top gate OFET device according to a second preferred embodiment of the present invention, comprising a substrate (1), source and drain electrodes (2), an OSC layer (3), a gate insulator layer (4) comprising a dielectric material, a gate electrode (5), a second insulator or protection layer (6) to shield the gate electrode from further layers or devices provided on top of the OFET, and an interlayer (7) comprising a copolymer as described above and below, which is located between the gate electrode (5) and the second insulator layer (6).

Figure 6:
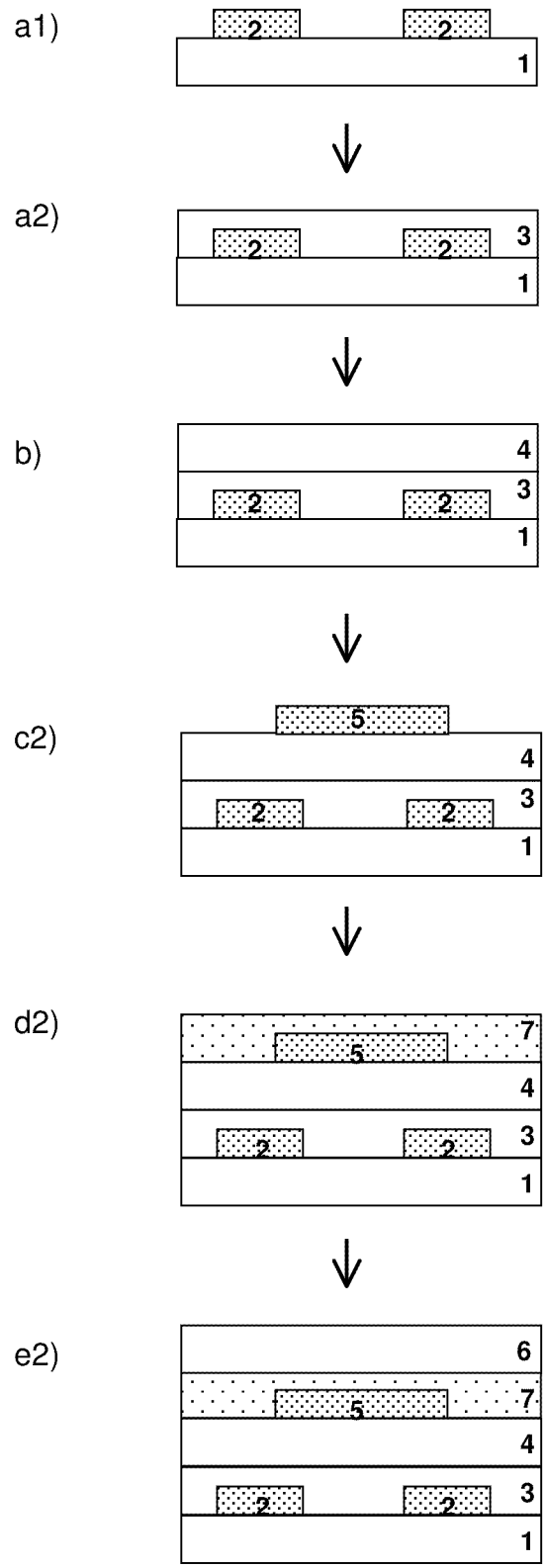
FIG. 6 illustrates a process for preparing an OFET according to the second embodiment of the present invention.

A preferred process for preparing said device of the second preferred embodiment is shown in FIG. 6 and comprises the following steps:
a1) depositing source and drain electrodes (2) on a substrate (1),
a2) depositing a layer of OSC material (3) on the substrate (1) and the source and drain electrodes (2),
b) depositing a first layer of dielectric material (4) on the OSC layer (3),
c2) depositing a gate electrode (5) on at least a part of the first dielectric layer (4),
d2) depositing at least one interlayer (7) as described above and below on the gate electrode (5) and the first dielectric layer (4), e2) depositing a second layer of dielectric material (6) on the interlayer (7).

Preferably deposition of the layers in the processes as described above and below is carried out by solution processing, i.e. applying a formulation, preferably a solution comprising the OSC or dielectric material and one or more organic solvents, onto the previously deposited layer, followed by evaporation of the solvent(s). Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Preferred solution deposition techniques are spin coating, flexographic printing and inkjet printing.

Preferably the interlayer (7) is deposited by solution processing, very preferably using a formulation comprising the copolymer as described above and below and one or more organic solvents. Preferred formulations comprise one or more solvents selected from organic ketones, preferably MEK, MAK (2-heptanone) or cyclohexanone, most preferably MAK. The concentration of the copolymer in the formulation is preferably from 0.1 to 5 wt. %. In particular organic ketone solvents with a high boiling point are advantageous for use in solutions for inkjet and flexographic printing.

The interlayer (7) should be selected to be thick enough to provide sufficient wettability and adhesion for the further layers coated on top of it, and thin enough so that it does not negatively affect device performance. Preferably the thickness of the interlayer (7) is from 1 to 1000 nm, very preferably from 1 to 100 nm, most preferably from 5 to 50 nm.

In a preferred embodiment the gate insulator layer (4) consists of a dielectric material ("gate dielectric") that has a dielectric constant (permittivity) $\in$ of 3.0 or less ("low k dielectric"), as disclosed in WO 03/052841, very preferably from 1.1 to 3.0, most preferably from 2.0 to 3.0, in particular from 2.5 to 3.0 or from 2.0 to 2.6. The low k gate dielectric material for the gate insulator layer directly in contact with the OSC is preferably an organic fluoropolymer. Suitable low k gate dielectric materials include, for example, highly soluble perfluoropolymers like those from the commercially available Cytop™ series (Asahi Glass), TeflonAF™ series (DuPont) or Hyflon AD™ series (from Solvay). Cytop polymers are described in "Modern Fluoroplastics", edited by John Scheris, John Wiley&Sons Ltd., 1997, Chapter: "Perfluoropolymers obtained by cyclopolymerisation" by N. Sugiyama, pages 541ff. Teflon AF is described in "Modern Fluoroplastics", edited by John Scheris, John Wiley&Sons Ltd., 1997, Chapter: "Teflon AF amorphous fluoropolymers" by P. R. Resnick, pages 397ff. Hyflon AD is described in "High Performance Perfluoropolymer Films and Membranes" V. Arcella et. al., Ann. N.Y. Acad. Sci. 984, pages 226-244 (2003).

The interlayer (7) preferably comprises, and very preferably exclusively consists of, a dielectric material that has a higher permittivity than the gate dielectric. The interlayer material preferably has a permittivity from 2.0 to 40, very preferably from 2.5 to 20.

The interlayer material comprises one or more copolymers as described above and below. The copolymer is selected to provide good adhesion on the layers directly in contact with it, especially the gate insulator layer (4) and the optional second dielectric layer (6). In particular, the copolymer should be selected such that the interlayer (7) shows a good adhesion on the gate dielectric fluoropolymer and at the same time has a sufficiently high surface energy, preferably >20 mN/m, very preferably >25 mN/m, most preferably ≧30 mN/m.

The inventors of the present invention have found that these requirements can be fulfilled if the copolymer used in the interlayer (7) comprises one or more "polar" repeating units and one or more "unpolar" repeating units as defined above and below.

Thus the interlayer in a device according to the present invention comprises, preferably essentially consists of, very preferably exclusively consists of, a copolymer comprising at least one polar repeating unit and at least one unpolar repeating unit. Preferably the copolymer essentially consists of, very preferably exclusively consists of, repeating units selected from the group consisting of such unpolar and polar units. The copolymer preferably comprises 1 to 5, very preferably 1, 2 or 3 of such polar units and 1 to 5, very preferably 1, 2 or 3 of such unpolar units.

For the purpose of this invention, "polar unit" means a monomeric or repeating unit of which its homopolymer has a surface energy of ≧30 mN/m (dynes/m), preferably from 30 to 50 mN/m, and "unpolar unit" means a monomeric or repeating unit of which its homopolymer shows a surface energy of ≦25 mN/m (dyne/cm), preferably from 10 to 25 mN/m, more preferably from 10 to 15 mN/m. The term "homopolymer" used in this connection means a polymer consisting exclusively of one type of monomeric or repeating units and having a molecular weight $M_W$>3,000.

According to the Polymer Handbook (4th Edition by J. Brandrup, E. H. Immergut, E. A. Grulke, Chapter "Surface and Interfacial Tensions of Polymers, Oligomers, Plasticizers, and Organic Pigments", by Souheng Wu, pages VI/521-22), usually the surface tension increases with increasing molecular weight. When the molecular weight $M_W$ is greater than about 2000-3000, the surface tension reaches within 1 mN/m (dyne/cm) of the value at infinitive molecular weight. Therefore, the effect of molecular weight can usually be neglected for polymers having a molecular weight $M_W$ of >3,000, but not for oligomers. Several exceptions have however been observed and explained in terms of end-group effects.

Suitable monomers and copolymers for use in the interlayer are described in the literature. For example, partially fluorinated materials like poly(vinyl fluoride) (PVF) and poly (vinylidene fluoride) (PVDF) have higher surface energies than PTFE. They also possess a relatively high polar contribution to the surface energy compared to e.g. polyethylene or PTFE, as shown in Table 1 below. Their corresponding monomers are therefore suitable as "polar units" according to the present invention.

TABLE 1

| Polymer | Chemical structure of monomer compared to polyethylene | $\gamma_s^d$ (mN/m) | $\gamma_s^p$ (mN/m) | $\gamma_s$ (mN/m) |
|---|---|---|---|---|
| Polytetrafluoroethylene (PTFE) | 4H replaced by F | 18.6 | 0.5 | 19.1 |
| Polytrifluoroethylene (PTrFE) | 3H replaced by F | 19.9 | 4.0 | 23.9 |

TABLE 1-continued

| Polymer | Chemical structure of monomer compared to polyethylene | $\gamma_s^d$ (mN/m) | $\gamma_s^p$ (mN/m) | $\gamma_s$ (mN/m) |
|---|---|---|---|---|
| Polyvinylidenefluoride (PVDF) | 2H replaced by F | 23.2 | 7.1 | 30.3 |
| Polyvinylfluoride (PVF) | 1H replaced by F | 31.3 | 5.4 | 36.7 |
| Low density PE | — | 33.2 | 1.1 | 33.2 |

$\gamma_s^d$ = Dispersion component of surface energy
$\gamma_s^p$ = Polar component of surface energy
$\gamma_s$ = Total surface energy The values in Table 1 are disclosed in: "Modern Fluoroplastics", edited by John Scheris, John Wiley&Sons Ltd., (1997), Chapter: "Adhesion Properties of Fluoropolymers" by D. M. Brewis and I Mathieson, pages 165ff; and in D. Owens and R. Wendt, Journal of Applied Polymer Science, Vol 13, 1741-1747 (1969).

Preferably the polar monomeric or repeating units are selected from partially fluorinated (i.e. fluorinated but not perfluorinated) hydrocarbon units, very preferably partially fluorinated alkylene units, having 2 to 8, most preferably 2 or 3 C atoms, wherein one or more C atoms can also be unfluorinated and/or wherein the number of F atoms is 1, 2, 3 or 4, preferably 1 or 2, like for example 1,1-difluoroethylene (vinylidene fluoride, VDF) or 1-fluoroethylene (vinylfluoride, VF).

The unpolar monomeric or repeating units are preferably selected from perfluorinated hydrocarbon groups, preferably alkylene, alkenylene or alkenylene which are straight chain, branched or cyclic, and wherein one or more F atoms may also be replaced by Cl or Br, very preferably perfluoro- or perfluoro/chloroalkylene units having 2 to 8 C atoms, most preferably 2, 3 or 4 C atoms, like for example tetrafluoroethylene (TFE), hexafluoropropylene (HFP) or chlorotrifluoroethylene (CTFE). It is also possible in these preferred units that 1 or 2 F atoms are replaced by H.

The total ratio of polar and unpolar repeating units should be selected such that the resulting copolymer has a surface energy of >20 mN/m, preferably >25 mN/m, very preferably of 30 mN/m or higher (caused by the "polar" units), and a good adhesion on the gate dielectric fluoropolymer (caused by interaction of the perfluorinated or unpolar units with the fluoropolymer). Preferably, the total amount of all polar units in the copolymer should be higher than 50 mol %.

Generally the monomeric units of the interlayer copolymer should be selected according to the following criteria and functionalities:

The monomers of the polar units (like VDF or VF) should allow random or alternating copolymerization with the monomers of the unpolar perfluorinated units (like e.g. TFE, HFP, CTFE), generate sufficient solubility (e.g. in polar solvents like low molecular weight ketones, such as MEK, MAK, cyclohexanone), and generate a surface energy higher than that of the gate dielectric fluoropolymer (>20 mN/m, preferably >25 mN/m, very preferably 30 mN/m or higher). The polar component of the surface energy is beneficial for bonding polar components. The polar unit should be integrated directly and preferably distributed randomly in the backbone of the polymer, so that it is present at the surface. If the polar unit is VDF its ratio in the copolymer is preferably higher than 50 mol %.

Instead of VDF or VF, other polar monomers can also be used if they are copolymerisable with the unpolar fluorinated co-monomers, and if their structure does not lead to a depletion of the polar unit at the surface e.g. by being attached too flexible and thus deplete from the surface inside the polymer because of thermodynamical reasons. Examples of suitable monomers can be found e.g. in Bruno Ameduri & Bernard Boutevin, Well-Architectured Fluoropolymers Synthesis, Properties and Applications, ISBN 0080443885, chapter 2.

The monomers of the unpolar perfluorinated units (like TFE or HFP) should allow random or alternating copolymerization with the monomers of the polar units (like e.g. VDF, VF), and generate sufficient solubility to prevent crystallization of the copolymer under the conditions of use (especially in case of longer perfluoroalkylenes like HFP). The unpolar unit should be integrated directly and preferably distributed randomly in the backbone of the polymer, so that it is present at the interface to the gate dielectric fluoropolymer to provide adhesion, but does not enrich or completely migrate to the surface.

Instead of TFE or HFP, other unpolar monomers can also be used if they are copolymerisable with the polar co-monomers, if their polarity and adhesion properties are optimized for good adhesion on the fluorinated dielectric, and if their structure does not lead to an enrichment at the surface and thus lowering of the surface energy, e.g. by being attached too flexible and thus migrate to the surface because of thermodynamical reasons.

The polar and unpolar units should be close to the polymer backbone to avoid an enrichment of unpolar or polar groups in the bulk or a phase separation within the copolymer. Also, enrichment of unpolar side chains at the air surface of the interlayer, which would reduce the surface energy, should be avoided. Alternatively or in addition, the ratio of the unpolar unit in the copolymer should be kept low enough to avoid phase separation. On the other hand, the unpolar side chain should be long enough, and/or its ratio in the copolymer should be high enough, to ensure good adhesion to the gate dielectric fluoropolymer. For example the unpolar unit HFP, which consists of a $CF_2$—CF group in the polymer backbone and a $CF_3$ group in the side chain, is suitable to keep a good balance between these requirements.

Alternating, random or statistical copolymers are more preferred than block copolymers. Thus, it is important that the unpolar and polar components can be copolymerized randomly or alternating (distributed). A pronounced block polymerization has to be avoided to prevent phase separation effects, which could lead to an enrichment of the perfluorinated chain segments at the surface and thus lead to a lower surface energy.

The literature reports copolymers of partially fluorinated units like VDF and/or VF with several unpolar fluorinated monomers like TFE, HFP or CTFE, which are known to be random copolymers and which are even commercially available. Since HFP has a very low reactivity and usually does not form dyads or homopolymerize, and TFE and VDF nearly have similar reactivity values, typically statistical copolymers are formed. This is for example described in "Modern Fluoroplastics", edited by John Scheris, John Wiley&Sons Ltd., 1997, Chapter: "Fluorocarbon Elastomers" by V. Arcella et al., pages 71ff and chapter: "Thermoplastic copolymers of vinyldene fluoride" by C. Tournut, pages 577 ff.; L. Logothetis, Chemistry of fluorocarbon elastomers, Progress in Polymer Science, 1989, 14, pages 251-296; G. Brinati and V. Arcella, Kautschuk+Gummi-Kunstoffe, 1992, 45, pages 470ff.

Fluorocarbon monomers bearing a perfluorinated moiety in a sidechain (like e.g. fluorinated polyacrylates and polyurethanes) tend to create surfaces with very low surface energies, even if the ratio of the monomer with the fluorinated side chain is relatively low. This is augmented by a backbone, which has sufficient mobility to present the fluorinated group to the air interface, and is thermodynamically favored because it reduces the interfacial free energy between the polymer and air. Such polymers are described from example in "Modern Fluoroplastics", edited by John Scheris, John Wiley&Sons Ltd., 1997, Chapter: "Fluorocarbon Elastomers" by V. Arcella et al., pages 71ff. Therefore polymers consisting only of such monomer units are not suitable for the purpose of the present invention. In contrast, in the polymers of the present invention the perfluorinated hydrocarbon groups of the unpolar units form a part of the polymer backbone.

In another preferred embodiment of the present invention the copolymer further comprises one or more units comprising one or more crosslinkable groups, i.e. a group capable of a crosslinking reaction ("crosslinking unit").

Suitable and preferred crosslinkable groups include for example hydroxy, amine, isocyanate, epoxy and bromine groups.

Suitable monomers and copolymers of this type are described in the literature. For example, copolymerisation of VDF and/or VF and/or TFE and/or HFE and others with suitable functional groups bearing monomers like vinyl or allyl ethers and vinyl glycidyl ethers (epoxy group) or various alcohol containing monomers (e.g. $F_2C=CF-CH_2OH$) or bromine containing monomers (e.g. $F_2C=CF-CH_2Br$) are extensively described in the literature, e.g. in Bruno Ameduri & Bernard Boutevin, Well-Architectured Fluoropolymers Synthesis, Properties and Applications, ISBN 0080443885, chapter 2 and literature cited herein or in Polymeric materials encyclopedia/editor in chief J. C. Salamone, ISBN 0-8493-2470-X, chapter "fluoropolymer coatings", pages 2498-2507 and literature cited therein.

Polymers containing epoxy groups are suitably crosslinked thermally, for example with a crosslinker selected from amines, melamines, alcohols or isocyanates, etc. Polymers containing alcohol groups are suitably crosslinked thermally, for example with a crosslinker selected from isocyanates and epoxy-groups. Polymers containing bromine groups are suitably crosslinked for example via a radical mechanism, preferably in the presence of a radicalic initiator.

Examples for isocyanate cured resins are described in "Modern Fluoroplastics", edited by John Scheris, John Wiley&Sons Ltd., 1997, Chapter 6: "Fluorinated Polyurethanes" by R. F. Brady, pages 127ff. JP 07-018214 A describes the isocyanate curing of a 40:10:40:10 TFE:HFE: VDF:4-hydroxyethyl-allylether copolymer. C. Tournut describes VDF copolymers containing curable groups in "Modern Fluoroplastics", edited by John Scheris, John Wiley&Sons Ltd., 1997, chapter: "Thermoplastic copolymers of vinylidene fluoride" by C. Tournut, pages 577 ff.

Copolymers comprising VDF units are suitably crosslinked with amines and peroxides as described for example in "Modern Fluoroplastics", edited by John Scheris, John Wiley&Sons Ltd., 1997, Chapter: "Fluorocarbon Elastomers" by V. Arcella et al., pages 71ff; and "Polymeric materials encyclopedia"/editor in chief J. C. Salamone, ISBN 0-8493-2470-X, Chapter: "Fluoropolymer coatings", pages 2498-2507 and literature cited therein.

Very preferably the crosslinking unit is a partially fluorinated or perfluorinated hydrocarbon group, preferably having 2 to 8, most preferably 2, 3 or 4 C atoms, wherein one or more H atoms or F atoms are replaced by a crosslinkable group, preferably a group which can be reacted in a polymer analogous reaction with another reactive group that is part of a polymer backbone or is attached to a polymer backbone, very preferably a hydroxy, amine, isocyanate, epoxy or bromine group.

Most preferably the copolymer comprises one or more 1,1-difluoroethylene (VDF) and/or 1-fluoroethylene (VF) repeating units and at least one, preferably one, two or three further repeating units selected from fluorinated hydrocarbon groups which are straight chain, branched or cyclic, very preferably straight chain or branched. The further repeating units are preferably selected from partially fluorinated or perfluorinated straight chain or branched alkyl or alkoxy groups, preferably having from 2 to 8, most preferably from 2, 3 or 4 C atoms. Preferred fluoroalkyl repeating units are e.g. tetrafluoroethylene (TFE), hexafluoropropylene (HFP) and chlorotrifluoroethylene (CTFE). The copolymers are derived from vinylidene fluoride ($CH_2=CF_2$) and/or vinylfluoride ($CH_2=CHF$) monomers, and fluorinated or perfluorinated monomers containing ethylenic unsaturation, like e.g. tetrafluoroethylene ($CF_2=CF_2$) or hexafluoropropylene ($CF_2=CF-CF_3$).

Especially preferably the copolymer is a terpolymer of VDF, HFP and TFE, preferably of formula 1, or a copolymer of VDF and HFP, preferably of formula 2:

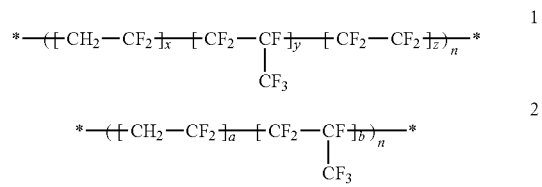

wherein n is an integer >1, $0<x<1$, $0<y<1$, $0<z<1$, $0<a<1$, $0<b<1$, $x+y+z=1$, $a+b=1$, preferably $0.5 \leq x<1$ and $0.5 \leq a <1$.

Polymers of formula 1 are e.g. commercially available under the Dyneon™ THV series (from Dyneon GmbH&Co. KG, Burgkirchen, Germany), like e.g. Dyneon™ THV 220 A. These polymers are also described in "Modern Fluoroplastics", edited by John Scheris, John Wiley&Sons Ltd., 1997, Chapter 13: "THV Fluoroplastic" by D. E. Hull et al., pages 257ff. For example, Dyneon™ THV 220 A has a permittivity of >4.

Polymers of formula 2 are commercially available in different grades and ratios e.g. under the Kynar™ series (from Arkema, Colombes, France), e.g. Kynar 2801 (88% VdF: 12% HFP) or under the SOLEF™ series (copolymers of VDF/HFP or $VF_2$/HFP) from Solvay Fluoropolymers Inc. or via Sigma-Aldrich (product Nr. 427160). These polymers are also described in "Modern Fluoroplastics", edited by John Scheris, John Wiley&Sons Ltd., 1997, chapter: "Thermoplastic copolymers of vinylidene fluoride" by C. Tournut, pages 577 ff.

In a preferred embodiment of the present invention the electronic device further comprises an additional stabilizing layer (8) on top of the interlayer (7), to improve the structural integrity and durability of the interlayer. This helps to reduce cracking or wrinkling problems that may be caused when heating the interlayer to or above $T_g$ of the fluorocopolymer, e.g. when providing the gate electrode on top of it. The stabilizing layer (8) preferably comprises a curable (i.e. polymerisable or crosslinkable) or cured (i.e. polymerised or crosslinked) material, preferably an organic material.

Suitable and preferred materials for the stabilizing layer (8) are glass resins like for example silanol-functional polymers, such as polysilsesquioxanes as described for example in U.S. Pat. No. 5,861,235. Especially suitable and preferred are commercially available polysilsesquioxanes or their precursors, like the materials of the HardSil™ series (from Gelest Inc., Morrisvile, Pa., USA) such as HardSil™ AM, a formulation of a polysilsesquioxane resin 19-21% in a mixture of alcohols, the materials of the AS Hardcoat™ or SHC™ series (from Momentive Performance Materials Inc., Wilton, Conn., USA) such as AS4000 Hardcoat™, AS4700 Hardcoat™ or SHC™ 5020, or materials such as GR650F™ (from Techneglas Inc., Perrysburg, Ohio, USA).

The curable or cured material of the stabilizing layer (8) is preferably dissolved in a solvent, which is preferably a solvent orthogonal to the solvent used for the material of the interlayer (7), for example an alcohol like butanol or isopropanol. The solution is then deposited onto the device as described above and below and optionally cured to form the stabilizing layer (8).

In case a curable material is used, it can be cured after deposition and optionally removal of the solvent for example by exposure to heat or radiation, preferably by thermal curing, very preferably thermal curing below 120° C., or by photocuring, very preferably UV photocuring. Optionally curing is initiated or aided by adding an initiator, like a photoinitiator, or a UV base generator, for example as described in U.S. Pat. No. 5,861,235, to the curable material or the formulation. Suitable photoinitiators are known to the person skilled in the art and are described in the literature. Preferably methods and materials for non-ionic polymerisation or curing are used, to avoid formation and diffusion of ionic impurities to the OSC/gate dielectric interface where they could negatively affect device performance.

Figure 7:
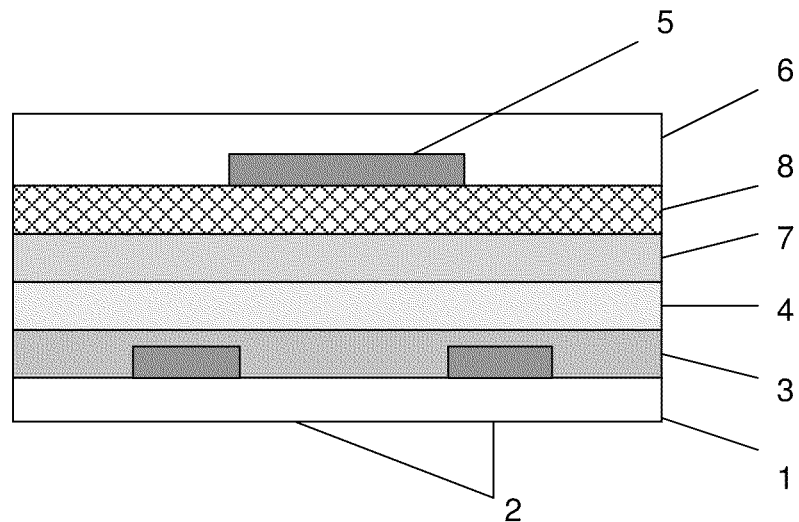
FIG. 7 depicts a top gate OFET device according to a third preferred embodiment of the present invention.

A top gate OFET device according to a third preferred embodiment is exemplarily illustrated in FIG. 7, and comprises the components (1)-(7) in the assembly as described in FIG. 3, and additionally comprises a cured stabilizing layer (8) on top of the interlayer (7).

A preferred process for preparing said device comprises the following steps:

a1) depositing source and drain electrodes (2) on a substrate (1),
a2) depositing a layer of OSC material (3) on the substrate (1) and the source and drain electrodes (2),
b) depositing a first layer of dielectric material (4) on the OSC layer (3),
c1) depositing at least one interlayer (7) as described above and below on the first dielectric layer (4),
c2) depositing a layer of a curable or cured material (8) on top of the interlayer (7) and optionally curing the material,
d1) depositing a gate electrode (5) on at least a part of the cured layer (8),
e1) optionally depositing a second layer of dielectric material (6) on the gate electrode (5) and the cured layer (8).

Figure 8:
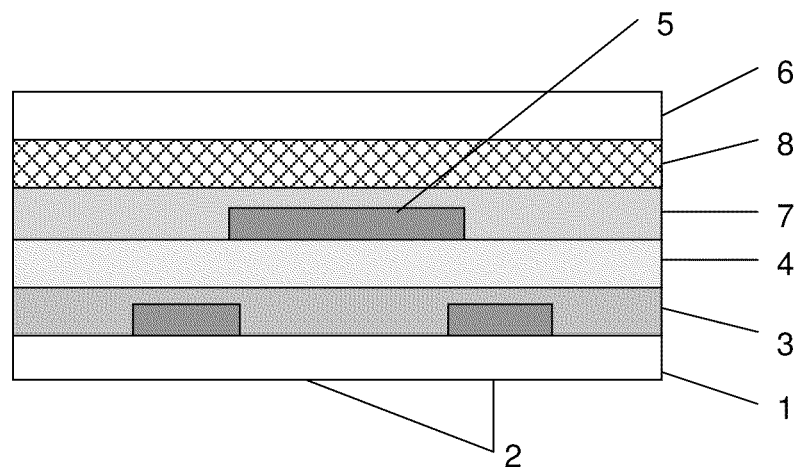
FIG. 8 depicts a top gate OFET device according to a fourth preferred embodiment of the present invention.

A top gate OFET device according to a fourth preferred embodiment is exemplarily illustrated in FIG. 8, and comprises the components (1)-(7) in the assembly as described in FIG. 5, and additionally comprises a cured stabilizing layer (8) on top of the interlayer (7).

A preferred process for preparing said device comprises the following steps:

a1) depositing source and drain electrodes (2) on a substrate (1),
a2) depositing a layer of OSC material (3) on the substrate (1) and the source and drain electrodes (2),
b) depositing a first layer of dielectric material (4) on the OSC layer (3),
c2) depositing a gate electrode (5) on at least a part of the first dielectric layer (4),
d2) depositing at least one interlayer (7) as described above and below on the gate electrode (5) and the first dielectric layer (4),
d3) depositing a layer of curable or cured material (8) on top of the interlayer (7) and optionally curing the material,
e2) depositing a second layer of dielectric material (6) on the cured layer (8).

Alternatively or in addition to the separate stabilizing layer (8) on top of the interlayer (7), it is also possible to use a curable or cured material as a component of the interlayer material (7), preferably an organic material like e.g. an organopolysiloxane or a precursor thereof. The curable material is e.g. a monomeric or oligomeric compound with two or more polymerisable groups, which upon curing provide a crosslinked polymer, or e.g. a thermally curable silsesquioxane precursor as described above. It is preferably dissolved together with the interlayer copolymer in a suitable solvent to provide a coatable or printable interlayer formulation, which is deposited onto the device and optionally cured as described above and below to form the interlayer (7).

The other components or functional layers of the electronic device, like the substrate, the gate insulator, the electrodes, and the OSC layer, can be selected from standard materials, and can be manufactured and applied to the device by standard methods. Suitable materials and manufacturing methods for these components and layers are known to the person skilled in the art and are described in the literature.

The deposition methods include liquid coating and vapour or vacuum deposition. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Generally the thickness of a functional layer in an electronic device according to the present invention may be from 1 nm (in case of a monolayer) to 10 μm, preferably from 1 nm to 1 μm, more preferably from 1 nm to 500 nm.

Various substrates may be used for the fabrication of organic electronic devices, for example glass or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetra-fluoroethylene, fibre glass enhanced plastic, fluorocarbon polymers, hexafluoropropylenevinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones. Preferred substrate materials are polyethyleneterephthalate, polyimide, and polyethylenenaphthalate. The substrate may be any plastic material, metal or glass coated with the above materials. The substrate should preferably be homogenous to ensure good pattern definition. The substrate may also be uniformly pre-aligned by extruding, stretching, rubbing or by photochemical techniques to induce the orientation of the organic semiconductor in order to enhance carrier mobility.

The electrode can be deposited by liquid coating, such as spray-, dip-, web- or spin-coating, or by vacuum deposition or vapour deposition methods. Suitable electrode materials and deposition methods are known to the person skilled in the art. Suitable electrode materials include, without limitation, inorganic or organic materials, or composites of the two. Examples for suitable conductor or electrode materials include polyaniline, polypyrrole, PEDOT or doped conjugated polymers, further dispersions or pastes of graphite or particles of metal such as Au, Ag, Cu, Al, Ni or their mixtures as well as sputtercoated or evaporated metals, like e.g. Cu, Cr, Pt/Pd etc., and semiconductors like e.g. ITO. Organometallic precursors may also be used deposited from a liquid phase.

The OSC materials and methods for applying the OSC layer can be selected from standard materials and methods known to the person skilled in the art, and are described in the literature.

In case of OFET devices, where the OFET layer is an OSC, it may be an n- or p-type OSC, which can be deposited by vacuum or vapour deposition, or preferably deposited from a solution. Preferred OSCs have a FET mobility of greater than $10^{-5}$ cm$^2$V$^{-1}$s$^{-1}$.

The OSC is used for example as the active channel material in an OFET or a layer element of an organic rectifying diode. OSCs that are deposited by liquid coating to allow ambient processing are preferred. OSCs are preferably spray-, dip-, web- or spin-coated or deposited by any liquid coating technique. Ink-jet deposition is also suitable. The OSC may optionally be vacuum or vapour deposited.

The semiconducting channel may also be a composite of two or more of the same types of semiconductors. Furthermore, a p-type channel material may, for example be mixed with n-type materials for the effect of doping the layer. Multilayer semiconductor layers may also be used. For example the semiconductor may be intrinsic near the insulator interface and a highly doped region can additionally be coated next to the intrinsic layer.

The OSC material may be any conjugated aromatic molecule containing at least three aromatic rings. The OSCs preferably contain 5, 6 or 7 membered aromatic rings, and more preferably contain 5 or 6 membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N(R$^3$)(R$^4$), where R$^3$ and R$^4$ each independently is H, optionally substituted alkyl, optionally substituted aryl, alkoxy or polyalkoxy groups. Where R$^3$ and R$^4$ is alkyl or aryl these may be optionally fluorinated.

The rings may be optionally fused or may be linked with a conjugated linking group such as —C(T$_1$)=C(T$_2$)-, —C≡C—, —N(R')—, —N=N—, (R')=N—, —N=C(R')—. T$_1$ and T$_2$ each independently represent H, Cl, F, —C≡N or lower alkyl groups particularly C$_{1-4}$ alkyl groups; R' represents H, optionally substituted alkyl or optionally substituted aryl. Where R' is alkyl or aryl these may be optionally fluorinated.

Other OSC materials that can be used in this invention include compounds, oligomers and derivatives of compounds selected from the group comprising conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; C$_{60}$ and C$_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Preferred compounds are those from the above list and derivatives thereof which are soluble.

Especially preferred OSC materials are substituted oligoacenes such as pentacene, tetracene or anthracene, or heterocyclic derivatives thereof, in particular bis(trialkylsilylethynyl) oligoacenes or bis(trialkylsilylethynyl) heteroacenes, as disclosed for example in U.S. Pat. No. 6,690,029 or WO 2005/055248 A1.

In another preferred embodiment of the present invention the OSC layer comprises one or more organic binders to adjust the rheological properties as described for example in WO 2005/055248 A1.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

Unless stated otherwise, above and below all percentages are percent by weight, temperatures are given in degrees Celsius, and the values of the surface energy, contact angle and dielectric constant refer to 20° C.

Unless stated otherwise, the values of the surface energy cited in this application refer to those calculated from contact angle measurement of the polymers according to the method described in D. K. Owens, R. C. Wendt, "Estimation of the surface free energy of polymers", Journal of Applied Polymer Science, Vol 13, 1741-1747, 1969; or "Surface and Interfacial Tension Measurement, Theory, and Applications (Surfactant Science Series Volume 119)" by Stanley Hartland (Editor), Taylor & Francis Ltd; 2004 (ISBN: 0-8247-5034-9), chapter 7, p.: 375: "Contact Angle and Surface Tension Measurement" by Kenji Katoh).

Example 1

Contact angles of the polymers as shown in Table 2 are measured and their surface energy $\gamma_s$ is calculated as described above. The values are in line with data reported in the literature. Values for the dielectric constant are taken from the literature.

TABLE 2

| Polymer | Contact angle $H_2O$ | Contact angle $CH_2I_2$ | $\gamma_s$ (mN/m) | Dielectric constant |
|---|---|---|---|---|
| Cytop ™ 809 (from Asahi)[1] | 110-112° | 77-79° | ~19 | 2.1-2.2 (60-10⁹ Hz) |
| Teflon AF ™ 2400 (from Dupont)[2] | 104-106° | 84-86° | ~16 | ~1.9 (1-10⁹ Hz ASTM D150) |
| THV220 (from Dyneon)[3] VDF/TFE/HFP terpolymer "A" | 92-95° | 55-57° | ~30 | 5.7 (10⁹ Hz) |
| P(VDF: HFP) copolymer (from Aldrich)[4] (Aldrich, Product number 42,716-0 CAS: 9011-17-0)[4] "B" | 88-91° | 55-56 | ~31 | 11.4 (100 Hz ASTM D150) |
| Polyvinylidenefluorde (PVDF)[5] (from Aldrich, Product | 85-87° | 52-54° | ~33 | 8-9.5 (100 Hz ASTM |

TABLE 2-continued

| Polymer | Contact angle $H_2O$ | Contact angle $CH_2I_2$ | $\gamma_s$ (mN/m) | Dielectric constant |
|---|---|---|---|---|
| number 427144, CAS: 24937-79-9)[5] "C" | | | | D150) |

$\gamma_s$ = Total surface energy

[1] see also "Modern Fluoroplastics", edited by John Scheris, John Wiley&Sons Ltd., 1997, Chapter: "Perfluoropolymers obtained by cyclopolymerisation" by N. Sugiyama, pages 541ff
[2] see also "Modern Fluoroplastics", edited by John Scheris, John Wiley&Sons Ltd., 1997, Chapter: "Teflon AF amorphous fluoropolymers" by P. R. Resnick, pages 397ff
[3] see US 2007/0190871 A
[4] see datasheet http://www.sigmaaldrich.com/catalog/search/ProductDetail/ALDRICH/427160, similar contact angles for water are documented in the datasheets for Solvay SOLEF ™ VDF/HFP copolymers SOLEF 11008, 21216 and 21508 (all same CAS-number) on www.solvaymembranes.com
[5] see datasheet http://www.sigmaaldrich.com/catalog/search/ProductDetail/ALDRICH/427144 and "Modern Fluoroplastics", edited by John Scheris, John Wiley&Sons Ltd., 1997, Chapter: "Adhesion Properties of Fluoropolymers" by D. M. Brewis and I. Mathieson, pages 165ff Copolymer A (VDF/HFP/TFE) and copolymer B (VDF/HFP) do both exhibit a high surface energy >25 mN/m. In addition, they do each comprise a polar unit (VDF) and an unpolar unit (TFE and HFP in case of polymer A; TFE in case of polymer B) according to the definitions given above. Thus, a layer consisting of either polymer A or B represents an interlayer according to the present invention. In contrast thereto, polymer C(PVDF) does also exhibit a high surface energy, but contains only polar units (VDF). Thus, a layer consisting of polymer C does not represent an interlayer according to the present invention.

Films of approx. 100 nm thickness are coated from 2% MAK (2-Heptanone) solutions of polymer A, polymer B and polymer C, respectively, via spincoating on glass and on a ~1 µm thick layer of the fluoropolymer Cytop™ 809 (coated on a glass substrate), which consists of unpolar units and has a low surface energy (see Table 2).

It is found that a solution of polymer A or B according to the invention coats well on top of the unpolar Cytop layer, while polymer C does not adhere to the Cytop layer and no continuous film is deposited. Contact angle measurements of the double layers are performed, resulting in the same values as stated in Table 2 in case of polymers A and B, but resulting in the initial value for Cytop in the case of polymer C.

This shows that copolymers A and B according to the present invention are suitable for preparing an interlayer that increases the surface energy of a fluoropolymer dielectric like Cytop, thereby improving its adhesion to further layers prepared on top of it. In contrast thereto, a homopolymer consisting only of polar units, like polymer C, is not suitable for preparing an interlayer.

Example 2

Top-gate OFET devices according to the invention comprising a 1 µm layer of Cytop™ 809 and a 0.1 µm interlayer of copolymer A or B, respectively, are prepared as described below and compared to a reference sample comprising only a Cytop layer, but no interlayer. The device performance is tested as described below.

Figure 9:
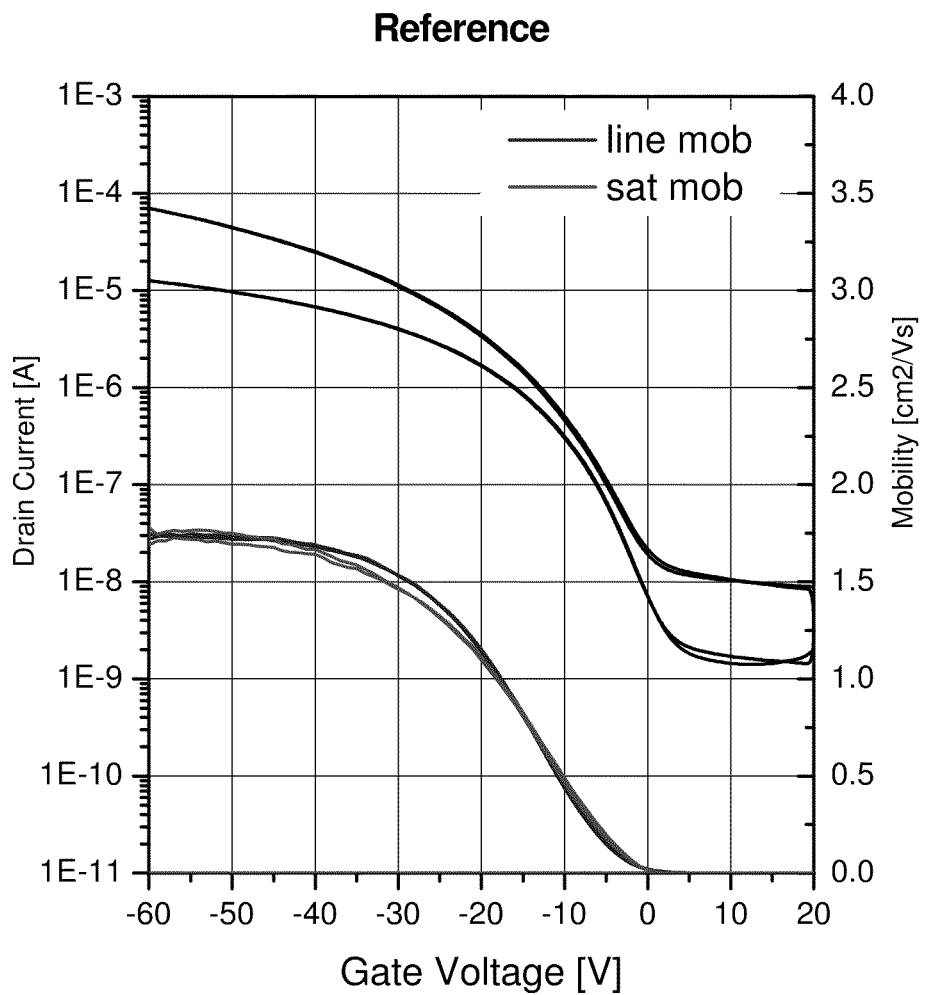
FIGS. 9-11 depict the transistor characteristics of top-gate OFETs prepared according to Example 1.
Figure 10:
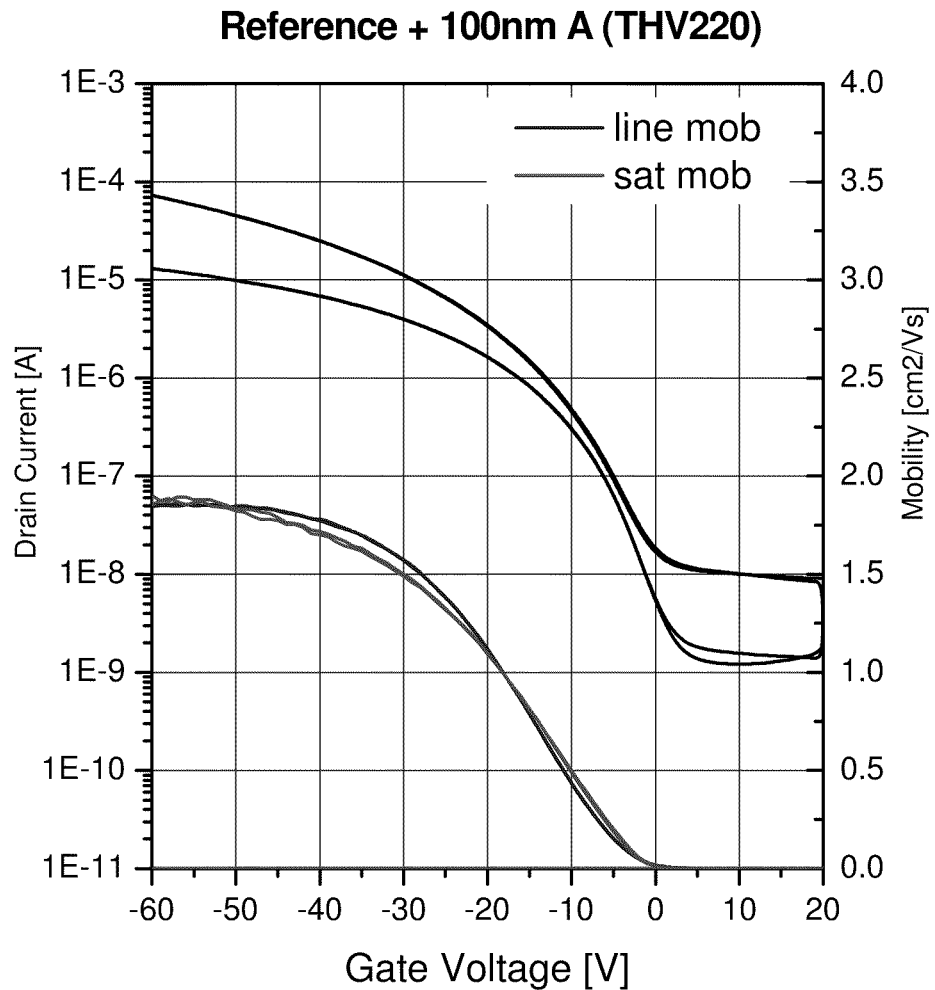
Figure 11:
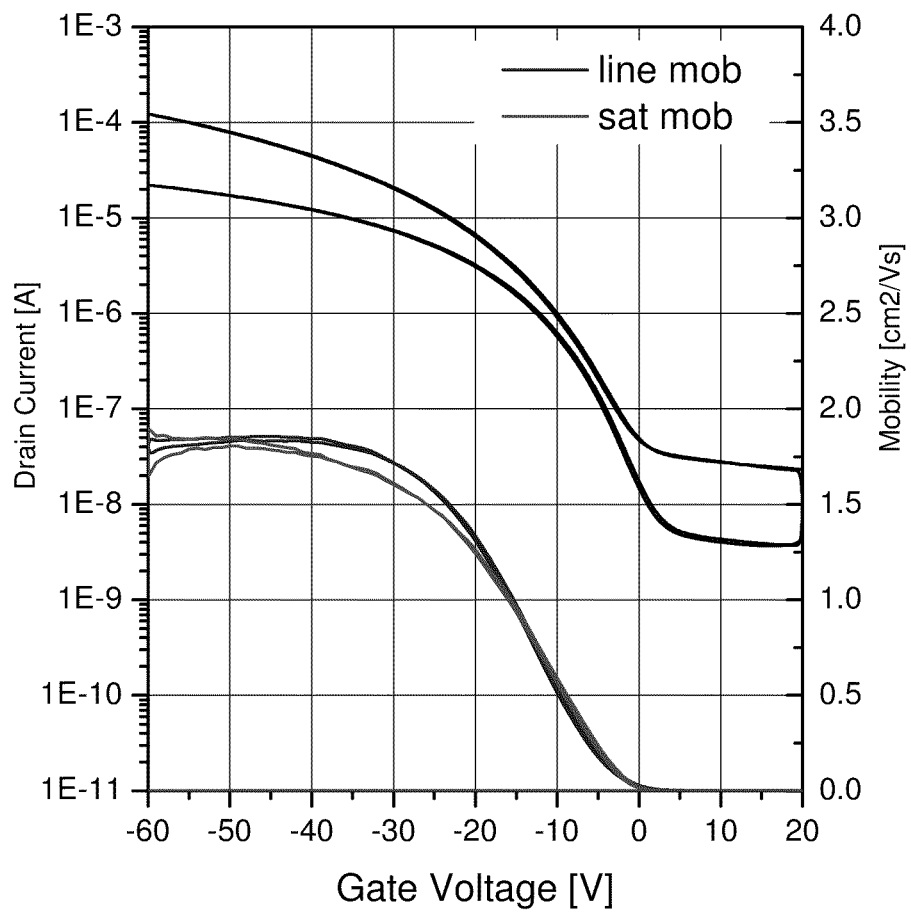

The results are shown in FIG. 9 (reference device), FIG. 10 (device with interlayer of copolymer A) and FIG. 11 (device with interlayer of copolymer B). It can be seen that the devices comprising an interlayer according to the invention show good performance (charge carrier mobility and on/off ratio), which is comparable to the reference device without an interlayer.

This shows that an interlayer of copolymer A or B increases the surface energy of the dielectric layer, but does not negatively affect device performance.

Detailed Procedure of Device Preparation

A top gat OFET is prepared as follows. A substrate of Corning 1737 glass is sonicated in 3% Decon90 for 30 min at 70° C., washed 2 times with water and sonicated in MeOH, then dried by spin off on the spincoater. Gold source and drain electrodes with 30 nm thickness are evaporated onto the substrate, creating a channel L=50 μm and W=1000 μm. The substrate is treated with the surface treatment formulation Lisicon™ M001 (available from Merck KGaA, Darmstadt, Germany) for 1 min, washed with isopropyl alcohol and dried by spin off on the spincoater. The OSC Formulation Lisicon™ S1283 (available from Merck KGaA, Darmstadt, Germany) is spun onto the substrate after above treatment and then annealed for 1 min at 100° C. on a hotplate. A dielectric layer of Cytop 809 (9% in FC-43, Asahi) is spun onto the cooled substrate (500 rpm for 10 s and 2000 rpm for 20 s) and heated on a hotplate for 2 min at 100° C. An interlayer from a solution of copolymer A or B, respectively, is spun on the cooled substrate from a 20 mg/ml solution in methyl ethyl ketone. Then a 30 nm gold layer is evaporated onto the interlayer as the gate electrode. For the electrical characterisation the sample is placed in a probe station and connected via Suess PH100 probe heads to an Agilent 4155C semiconductor analyzer. Linear and saturation mobility is calculated at VD=−5V and VD=−60V respectively using the following equations $$\mu_{LIN} = -\frac{L}{W*C_{ox}*VD} * \frac{\partial ID}{\partial VG}$$

$$\mu_{SAT} = \frac{2L}{W*C_{ox}} * \frac{\partial sqrtID}{\partial VG}$$

wherein L and W are length and width of the channel, Cox=dielectric capacitance [F/cm2], ID=drain current, sqrt ID=square root of absolute ID values, VG=gate voltage, VD=drain voltage.

The invention claimed is:

1. An electronic device comprising:
    an organic semiconductor (OSC) layer (3),
    a gate electrode (5),
    a gate insulator layer (4) comprising a dielectric material, said gate insulator layer being located between the OSC layer (3) and the gate electrode (5), and
    optionally an additional insulator layer (6) covering the gate electrode (5) and the gate insulator layer (4),
    wherein the device further comprises at least one interlayer (7) between the gate insulator layer (4) and the gate electrode (5), or between the gate electrode (5) and the additional insulator layer (6), and
    wherein the interlayer (7) comprises a copolymer comprising at least one polar repeating unit and at least one unpolar repeating unit, wherein said at least one polar unit is a repeating unit of which the homopolymer has a surface energy ≧30 mN/m, and said at least one unpolar unit is a repeating unit of which the homopolymer has a surface energy ≦25 mN/m.

2. The electronic device according to claim 1, wherein said device comprises
    optionally a substrate (1),
    source and drain electrodes (2),
    the OSC layer (3),
    said gate electrode (5),
    said gate insulator layer (4) comprising a dielectric material, located between the OSC layer (3) and the gate electrode (5),
    optionally said additional insulator layer (6) on top of the gate electrode (5),
    said interlayer (7) comprising a copolymer as defined in claim 1, which is located between the gate insulator (4) and the gate electrode (5), or between the gate electrode and the additional insulator layer (6).

3. The electronic device according to claim 2, wherein said device comprises said substrate (1).

4. The electronic device according to claim 3, wherein said device comprises said additional insulator layer (6) covering the gate electrode (5) and the gate insulator layer (4).

5. The electronic device according to claim 2, wherein said device comprises said additional insulator layer (6) covering the gate electrode (5) and the gate insulator layer (4).

6. The electronic device according to claim 1, wherein said interlayer (7) comprises a copolymer with a surface energy >25 mN/m.

7. The electronic device according to claim 1, wherein said interlayer (7) consists of a material that has a permittivity from 2.0 to 40.

8. The electronic device according to claim 1, wherein said interlayer (7) consists of a material that has a higher permittivity than the material of the gate insulator layer (4).

9. The electronic device according to claim 1, wherein said gate insulator layer (4) consists of a material that has a permittivity of from 1.1 to 3.0.

10. The electronic device according to claim 1, wherein said the thickness of said interlayer (7) is from 5 to 50 nm.

11. The electronic device according to claim 1, wherein said interlayer (7) comprises a copolymer comprising 1,1-difluoroethylene and/or 1-fluoroethylene repeating units and one or more repeating units selected from perfluorinated alkylene having 2 to 8 C atoms.

12. The electronic device according to claim 1, wherein said interlayer (7) comprises a copolymer of formula 1 or formula 2:

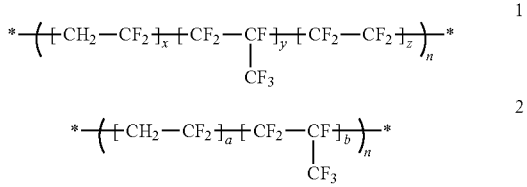

wherein n is an integer >1, 0<x<1, 0<y<1, 0<z<1, 0<a <1, 0<b<1, x+y+z=1, a+b=1.

13. The electronic device according to claim 1, wherein said copolymer of the interlayer (7) comprises one or more units comprising one or more crosslinkable groups.

14. The electronic device according to claim 1, wherein said interlayer (7) additionally comprises a curable or cured organic material.

15. The electronic device according to claim 1, wherein said device further comprises a stabilizing layer (8) of a cured material on top of the interlayer (7).

16. The electronic device according to claim 1, wherein said device is a top gate organic field effect transistor (OFET).

17. A process for preparing an electronic device according to claim 1, said process comprising:
    b) depositing a first layer of dielectric material of said a gate insulator layer (4) on the OSC layer (3);

and c1), d1), and e1) as follows:
c1) depositing said at least one interlayer (7) on the first dielectric layer (4),
d1) depositing said gate electrode (5) on at least a part of said at least one interlayer (7), and
e1) optionally depositing a second layer of dielectric material (6) on said gate electrode (5) and said at least one interlayer (7),
or c2), d2), and e2) as follows:
c2) depositing said gate electrode (5) on at least a part of the first dielectric layer (4),
d2) depositing said at least one interlayer (7) on said gate electrode (5) and said first dielectric layer (4), and
e2) depositing a second layer of dielectric material (6) on said at least one interlayer (7).

18. The process according to claim 17, comprising:
a1) depositing source and drain electrodes (2) on a substrate (1),
a2) depositing a layer of OSC material (3) on said substrate (1) and said source and drain electrodes (2),
b) depositing a first layer of dielectric material (4) on the OSC layer (3),
c1) depositing said at least one interlayer (7) on the first dielectric layer (4),
c2) depositing a layer of curable or cured material (8) on top of said at least one interlayer (7) and optionally curing the material,
d1) depositing said gate electrode (5) on at least a part of said at least one interlayer (7) or the cured layer (8), and
e1) optionally depositing a second layer of dielectric material (6) on said gate electrode (5) and said at least one interlayer (7) or said cured layer (8).

19. The process according to claim 17, comprising:
a1) depositing source and drain electrodes (2) on a substrate (1),
a2) depositing a layer of OSC material (3) on said substrate (1) and said source and drain electrodes (2),
b) depositing a first layer of dielectric material (4) on the OSC layer (3),
c2) depositing said gate electrode (5) on at least a part of the first dielectric layer (4),
d2) depositing said at least one interlayer (7) on said gate electrode (5) and said first dielectric layer (4),
d3) depositing a layer of curable or cured material (8) on top of said at least one interlayer (7) and optionally curing the material,
e2) depositing a second layer of dielectric material (6) on said at least one interlayer (7) or said cured layer (8).

20. The electronic device according to claim 1, wherein said interlayer (7) comprises a copolymer with a surface energy >30 mN/m.

21. The electronic device according to claim 1, wherein
the polar repeating units of said at least one interlayer (7) are selected from 1,1-difluoroethylene and 1-fluoroethylene, and
the unpolar repeating units are selected from tetrafluoroethylene, hexafluoropropylene and chlorotrifluoroethylene.

22. The electronic device according to claim 1, wherein said device comprises said additional insulator layer (6) covering the gate electrode (5) and the gate insulator layer (4).

* * * * *

UNITED STATES PATENT AND TRADEMARK OFFICE
CERTIFICATE OF CORRECTION

PATENT NO. : 8,426,848 B2
APPLICATION NO. : 12/989164
DATED : April 23, 2013
INVENTOR(S) : Mueller et al.

It is certified that error appears in the above-identified patent and that said Letters Patent is hereby corrected as shown below:

In the Claims:

Column 18, line 31 reads "said the thickness of said interlayer (7) is from 5 to 50 nm." Should read -- the thickness of said interlayer (7) is from 5 to 50 nm. --

Signed and Sealed this
Ninth Day of July, 2013

Teresa Stanek Rea
*Acting Director of the United States Patent and Trademark Office*